US007713821B2

(12) United States Patent
Hsu et al.

(10) Patent No.: US 7,713,821 B2
(45) Date of Patent: May 11, 2010

(54) THIN SILICON-ON-INSULATOR HIGH VOLTAGE AUXILIARY GATED TRANSISTOR

(75) Inventors: Sheng Teng Hsu, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 359 days.

(21) Appl. No.: 11/821,681

(22) Filed: Jun. 25, 2007

(65) Prior Publication Data

US 2008/0315304 A1 Dec. 25, 2008

(51) Int. Cl.
*H01L 21/336* (2006.01)
*H01L 31/119* (2006.01)

(52) U.S. Cl. ....................................... 438/262; 257/408

(58) Field of Classification Search ................. 438/157, 438/262–266; 257/336, E21.415, E29.261, 257/401, 408

See application file for complete search history.

(56) References Cited

U.S. PATENT DOCUMENTS 6,048,756 A * 4/2000 Lee et al. .................... 438/151
7,125,760 B1 * 10/2006 Reese et al. ................. 438/154
7,208,803 B2 * 4/2007 Ting ........................... 257/408
2003/0207512 A1 * 11/2003 Hsu ........................... 438/200

OTHER PUBLICATIONS

N. Nenadovic, et al, "RF Power Silicon-On-Glass VDMOSFETs" IEEE EDL25, #6 p. 424, 2004.
M. Wasekura et al, "An SOI-BiCDMOS Chipset for Automotive Electronically Controlled Brake System" 2006 IEEE SOI International OSI conference Proceeding, Paper 7.1.

* cited by examiner

*Primary Examiner*—Calvin Lee
(74) *Attorney, Agent, or Firm*—Law Office of Gerald Maliszewski; Gerald Maliszewski

(57) ABSTRACT

A silicon (Si)-on-insulator (SOI) high voltage transistor is provided with an associated fabrication process. The method provides a SOI substrate with a Si top layer. A control channel and an adjacent auxiliary channel are formed in the Si top layer. A control gate overlies the control channel and an auxiliary gate overlies the auxiliary channel. A source region is formed adjacent the control channel, and a lightly doped drain (LDD) region is interposed between the auxiliary channel and the drain. An interior drain region is interposed between the control and auxiliary channels. Typically, the Si top layer has a thickness in the range of 20 to 1000 nm. In one aspect, the Si top layer in the source, control channel, interior drain, and auxiliary channel regions is thinned to a thickness in the range of 5 to 200 nm, and raised source, drain, LDD, and interior drain regions are formed.

16 Claims, 5 Drawing Sheets

THIN SILICON-ON-INSULATOR HIGH VOLTAGE AUXILIARY GATED TRANSISTOR

BACKGROUND OF THE INVENTION

1. Field of the Invention

This invention generally relates to integrated circuit (IC) fabrication and, more particularly, to a double-diffused metal oxide semiconductor transistor (DMOST) with a multi-thickness channel fabricated on SOI for medium power device applications.

2. Description of the Related Art

FIG. 1 is a partially cross-sectional view of a vertical output DMOST device with substrate contact to the drain output (prior art). One limitation of a conventional planar MOS device is that the channel length is proportional to the breakdown voltage, but inversely proportional to current. That is, high current planar devices require a very short channel length and, therefore, have a very low breakdown voltage. To address this short channel limitation, DMOST devices were developed. A DMOST device is formed by a double-diffusion. For example, an n-channel DMOST is conventionally formed by a deep p+ implant, followed by a shallow n+ implant. Unlike planar MOS devices, which control channel length using a photolithographic process, the channel length of a DMOST is controlled by the difference between the diffusions of the p+ implant and the n+ implant species to form a p-body and n+ source regions.

State-of-the-art high voltage high power transistors are conventionally fabricated either on bulk silicon or on compound semiconductors. Compound semiconductor substrate costs are very high. In addition, the compound semiconductor processes are not compatible with silicon integrated circuit processes. As a result, the cost of compound semiconductor high voltage high power devices is very high and, therefore, not suitable for consumer applications. If fabricated on bulk silicon, the high voltage transistor must be a DMOST design. A DMOST utilizes double diffusion to form a very short channel length transistor with a very long depletion region to sustain high voltages.

A bulk silicon DMOST conventionally requires a large device area and, in addition, the output is made via the substrate contact, "underneath" the transistor active regions. Although front ("top") output lateral DMOSTs (LDMOSTs) have also been fabricated, the area required for these devices is even larger than for back output devices. The depletion area of the DMOST, whether it is back output or front output device, is also very large. The depletion region is the main source of the leakage current, which increases exponentially with temperature. Thus, the bulk silicon DMOST is not suitable for high temperature high voltage applications.

The use of silicon-on-insulator (SOI) substrates offers many potential advantages for the fabrication of high temperature power devices. Some of the potential advantages are: complete device isolation, small device size, low leakage current at high temperatures, and simple fabrication processes. The complete isolation of devices eliminates crosstalk among the devices in the same chip. Because of the isolation, power devices, linear circuits, and digital circuits can be integrated together without the use of large isolation areas. Potentially, a low leakage current can be achieved by using a very thin top active silicon film. The volume of the junction depletion layer would be small enough to not generate large leakage current even at high temperatures.

Power transistors have been fabricated on SOI substrates from bipolar transistor, conventional DMOS transistor designs, or as a combination of conventional DMOS and bipolar transistors. Since conventional DMOS and bipolar transistor designs both require thick silicon films, these designs fail to make use of all the above-mentioned potential advantages available with the use of SOI substrate. For example, Philip's A-BCD technology requires a 1.5 μm layer of active silicon films. A design proposed by Nenadovic requires a 5 μm of active top silicon film, and a design proposed by Wasekura requires a 12 μm layer of top active silicon film. Since the leakage current is proportional to the volume of the junction depletion region, these thick top active silicon films generate high leakage currents, which are especially problematic at high temperatures. Further, since conventional commercially available SOI wafers are fabricated with less than a 1.5 μm top active silicon film thickness, the above-mentioned thick-film designs require a high cost, custom type of SOI wafer.

It would be advantageous if a high power DMOST device could be fabricated on a SOI wafer using a thin active film region to minimize leakage current.

SUMMARY OF THE INVENTION

A unique high voltage high-power device structure is presented that can be fabricated using SOI wafers with top active silicon layer as thin as 20 nanometers (nm), to take full advantages of SOI technology. The device is a cascode device, with a control gate and an auxiliary gate. The auxiliary gate isolates the input (control) gate from the drain output, eliminating the Miller effect of the device. The effective input capacitance is very small, making high frequency operation of the device possible. The surface electrical field at the control gate-to-drain edge and at the auxiliary gate drain edge can be adjusted not only by the dopant density and length of the LDD region, but also by the auxiliary gate voltage.

Accordingly, a method is provided for fabricating a silicon (Si)-on-insulator (SOI) high voltage transistor. The method provides a SOI substrate with a Si top layer. A control channel and an adjacent auxiliary channel are formed in the Si top layer. A control gate overlies the control channel and an auxiliary gate overlies the auxiliary channel. A source region is formed adjacent the control channel, and a lightly doped drain (LDD) region is interposed between the auxiliary channel and the drain. An interior drain region is interposed between the control and auxiliary channels.

Typically, the Si top layer has a thickness in the range of 20 to 1000 nm. In one aspect, the Si top layer in the source, control channel, and interior drain is thinned to a thickness of less than 100 nm. Then, a Si layer is selectively deposited overlying source, drain, LDD, and interior drain regions, forming raised source, drain, LDD, and interior drain regions.

The control channel is p doped and the auxiliary channel is n doped. The source, drain, and interior drain regions are n+ doped, and the LDD region is n doped. The LDD region has a length in the range of 1 to 5 micrometers.

Additional details of the above-described method, and an SOI high voltage transistor are presented below.

DETAILED DESCRIPTION

Figure 1:
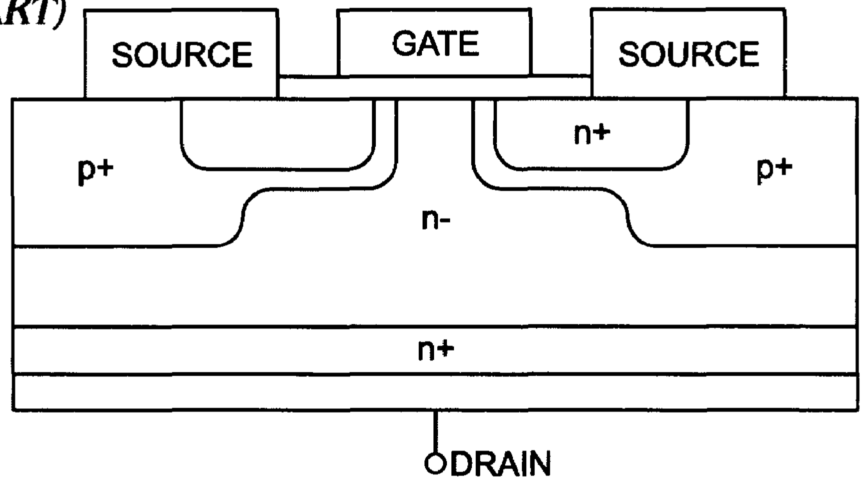
FIG. 1 is a partially cross-sectional view of a vertical output DMOST device with substrate contact to the drain (prior art).
Figure 2:
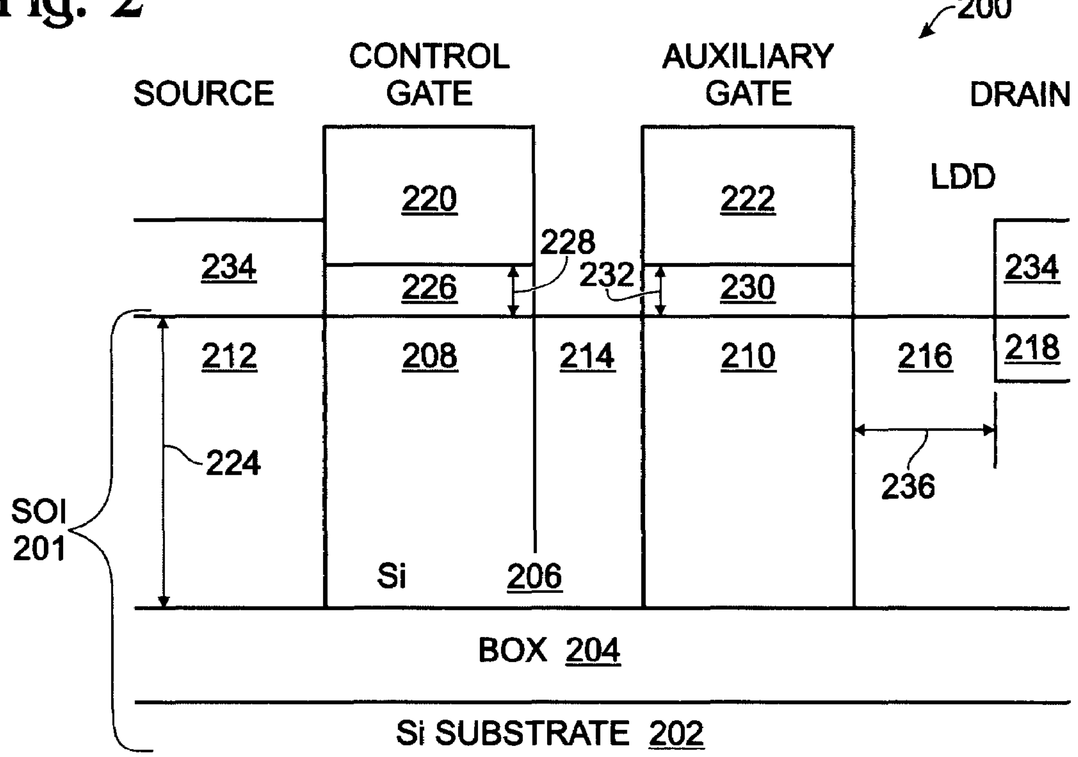
FIG. 2 is a partial cross-sectional view of a silicon (Si)-on-insulator (SOI) high voltage transistor.

FIG. 2 is a partial cross-sectional view of a silicon (Si)-on-insulator (SOI) high voltage transistor. The transistor 200 comprises a SOI substrate 201 formed from a Si substrate 202, a buried oxide (BOX) layer 204, and a Si top layer 206. A control channel 208 and an adjacent auxiliary channel 210 are formed in the Si top layer 206. The source 212 is adjacent the control channel 208, and an interior drain 214 is interposed between the control channel 208 and the auxiliary channel 210. The interior drain region 214 may be treated as a reference point, as the voltage at this point is the drain voltage for the control transistor. This region can be as small as possible.

A lightly doped drain (LDD) 216 is adjacent the auxiliary channel 210, and a drain 218 is adjacent the raised LDD region 216. A control gate 220 overlies the control channel 208, and an auxiliary gate 222 overlies the auxiliary channel 210. Typically, the Si top layer 206 has a thickness 224 in the range of 200 to 1000 nm.

Figure 3:
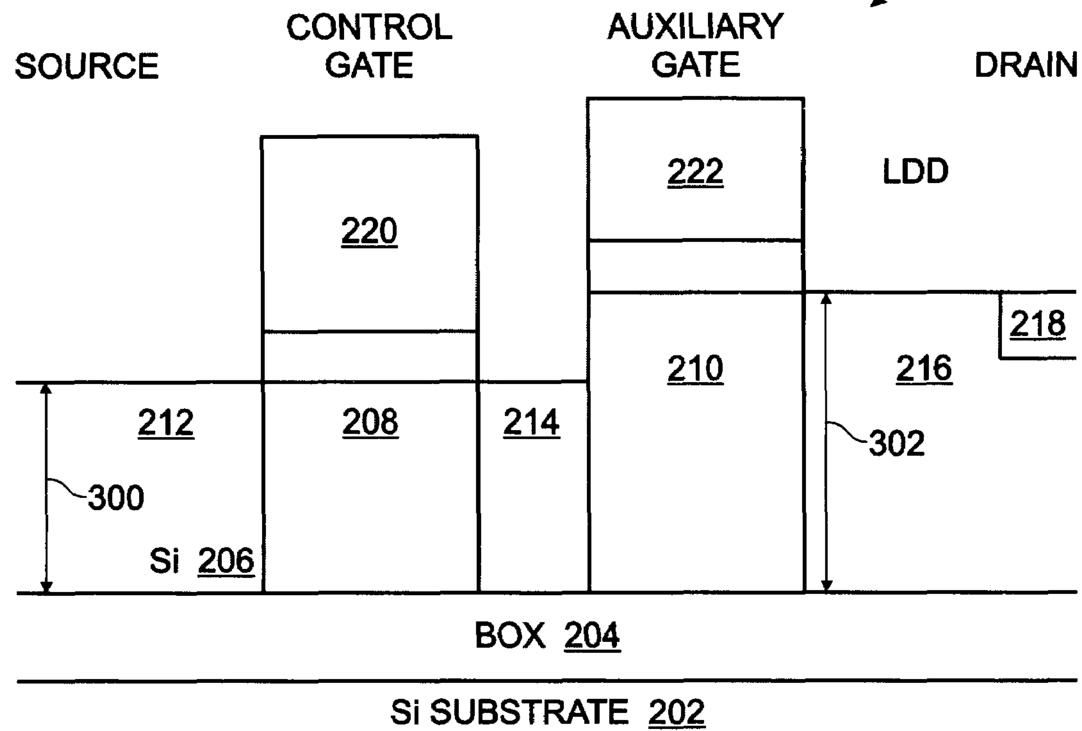
FIG. 3 is a partial cross-sectional view showing a variation of the SOI high voltage transistor of FIG. 2.

FIG. 3 is a partial cross-sectional view showing a variation of the SOI high voltage transistor of FIG. 2. In some aspects, the Si top layer 206 including the source 212, control channel 208, and interior drain 214, has a thickness 300 in the range of 5 to 200 nm, while the Si top layer 206 including the auxiliary channel 210, LDD 216, and drain region 218 has a thickness 302 in the range of 200 nm to 1000 nm.

Figure 4:
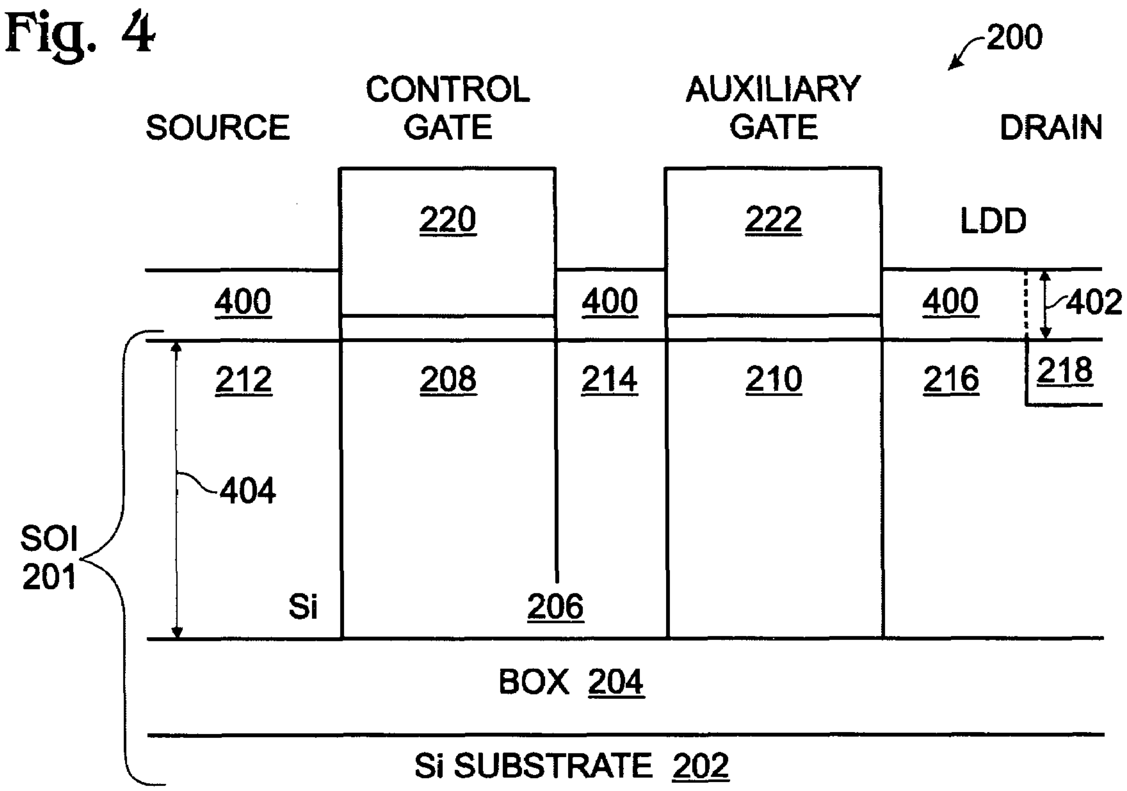
FIG. 4 is a partial cross-sectional view depicting another variation of the SOI high voltage transistor of FIG. 2.

FIG. 4 is a partial cross-sectional view depicting another variation of the SOI high voltage transistor of FIG. 2. In this aspect, the Si top layer 206 including the source 212, control channel 208, and interior drain 214, has a thickness 404 of less than 100 nm. A Si film 400 is selectively formed over Si top layer 206 having a thickness 402 in the range of 30 to 100 nm. As a result, raised source 212, raised drain 218, raised LDD 216, and raised interior drain 214 regions are formed.

Referencing FIGS. 2, 3, or 4, the control channel 208 has a p dopant density in the range from $1\times10^{16}$ to $1\times10^{18}$ per cubic centimeter ($cm^{-3}$). The auxiliary channel 210 is n doped, with a doping density in the range of $1\times10^{16}$ to $5\times10^{17}$ $cm^{-3}$. As shown in FIG. 2 (but also applicable to FIGS. 3 and 4), a gate dielectric 226 overlies the control channel 208 having a thickness 228 in the range of 1 to 100 nm. A gate dielectric 230 overlies the auxiliary channel 210 having a thickness 232 in the range of 30 to 500 nm. Optionally (as shown), silicide 234 may be formed overlying the source 212 and drain 218 regions. As another option (not shown), silicide 234 may be formed overlying the interior drain 214.

The LDD region 216 has a length 236 in the range of 1 to 5 micrometers. The source 212, drain 218, and interior drain 214 have n dopant densities in a range of $1\times10^{19}$ to $1\times10^{21}$ $cm^{-3}$. The LDD region 216 has an n dopant density in a range of $1\times10^{16}$ to $5\times10^{17}$ $cm^{-3}$. In some aspects, the LDD doping density is identical to the auxiliary channel doping densities.

As used herein, a heavily doped region, e.g., a heavily p doped region, is referred to as p+ (p+ doped), and is associated with dopant concentrations in the range of about $1\times10^{19}$ to $1\times10^{21}$ $cm^{-3}$. Regions with this degree of dopant are often contact areas. A moderately doped region, e.g., a moderately p doped region, is referred to as p (p doped), and is associated with dopant concentrations in the range of about $5\times10^{16}$ to $1\times10^{19}$ $cm^{-3}$. A lightly doped region, e.g., a lightly p doped region, is referred to as p− (p− doped), and is associated with dopant concentrations in the range of about $1\times10^{15}$ to $5\times10^{16}$ $cm^{-3}$. For the n-type layers, a heavily n doped region is referred to as n+ (n+ doped) and is associated with dopant concentrations in the range of about $1\times10^{19}$ to $1\times10^{21}$ $cm^{-3}$. A moderately doped or lightly doped n region is referred to as n doped, and is associated with dopant concentrations in the range of about $1\times10^{15}$ to $1\times10^{19}$ $cm^{-3}$. The term "n-type" refers to any amount of n doping. Likewise, "p-type" refers to any level of p doping.

Functional Description

Figure 5:
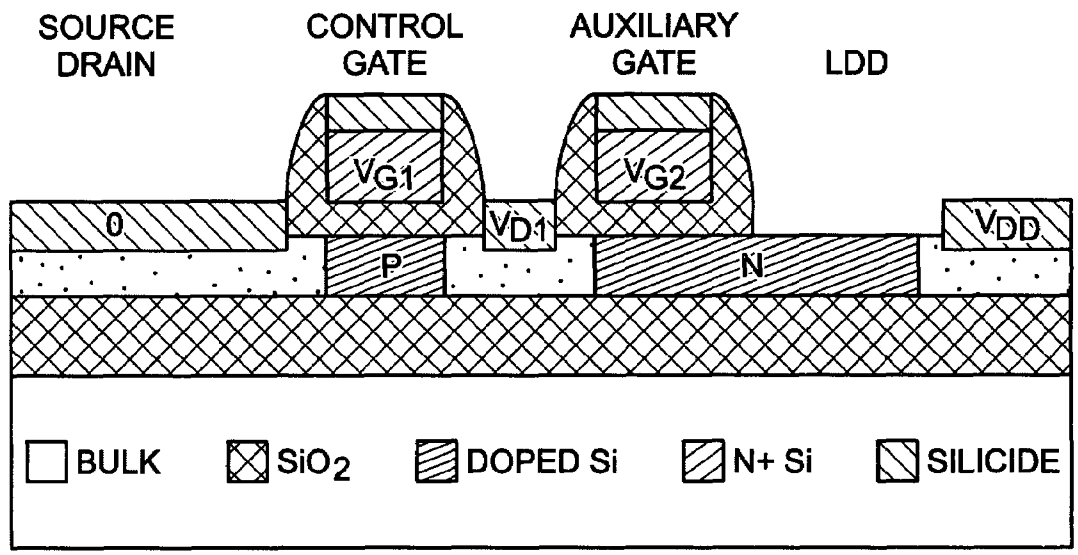
FIG. 5 is a partial cross-sectional view of the SOI high voltage transistor with voltage references.

FIG. 5 is a partial cross-sectional view of the SOI high voltage transistor with voltage references. The LDD drift region is assumed to be zero for this functional analysis. The thickness of the gate insulator under auxiliary gate can be either equal to, or thicker than the control gate dielectric. During normal operation the control gate is the input terminal. A positive voltage $V_{G2}$ is applied to the auxiliary gate and the drain bias voltage is $V_{DD}$. The voltage $V_{G2}$ can be slightly higher than the drain breakdown voltage of the control gate transistor. The voltage between control gate and the auxiliary gate is $V_{D1}$. Since $V_{G2}$ is relatively large at low drain bias voltages, the device is operated in the linear region, and the auxiliary gate has little effect on the device current. As the drain voltage is increased, the control gate channel pinches off. The voltage $V_{D1}$ increases with drain voltage $V_{DD}$, and the channel under the auxiliary gate is still operating in the linear mode. The current flow is given by:

$$I_D=K_1(V_{G1}-V_{T1})^2=K_2(V_{G2}-V_{T2}-V_{DD})(V_{DD}-V_{D1}) \quad (1)$$

As the drain voltage further increases, the channel under the auxiliary gate pinches off. The drain current is given by:

$$I_D=K_1(V_{G1}-V_{T1})^2=K_2(V_{G2}-V_{T2}-V_{D1})^2 \quad (2)$$

When the drain voltage is further increased, the voltage $V_{D1}$ also increases. The silicon under the auxiliary gate is completely depleted. The silicon under the auxiliary gate becomes a drift region, which prevents the breakdown of the control gate drain. The maximum drain voltage is therefore given by:

$$V_{DD(MAX)}\approx V_{D1(MAX)}+E_{BK}L_{AU}; \quad (3)$$

where $E_{BK}$ and $L_{AU}$ are the silicon breakdown field intensity and the length of the auxiliary gate, respectively.

If the length of the auxiliary gate is assumed to be 1 μm and the doping concentration of silicon under the auxiliary gate is $10^{16}/cm^3$, then $E_{BK}L_{AU}$=38V. The device can easily sustain a 40 V drain bias voltage.

If the effective electron mobility is assumed to be 400 $cm^2/Vs$, and the gate oxide and the length of the control gate are 10 nm and 0.5 μm, respectively, then the drain saturation current is about 1.23 A/mm.

In practical applications, a LDD drift region is added to reduce the surface electric field at the auxiliary gate drain edge. Therefore, the drain saturation current would be lower than the calculated number. To increase the drain saturation current and to reduce the on resistance, a thicker silicon film can be used under the auxiliary gate and on the LDD region.

Figure 6:
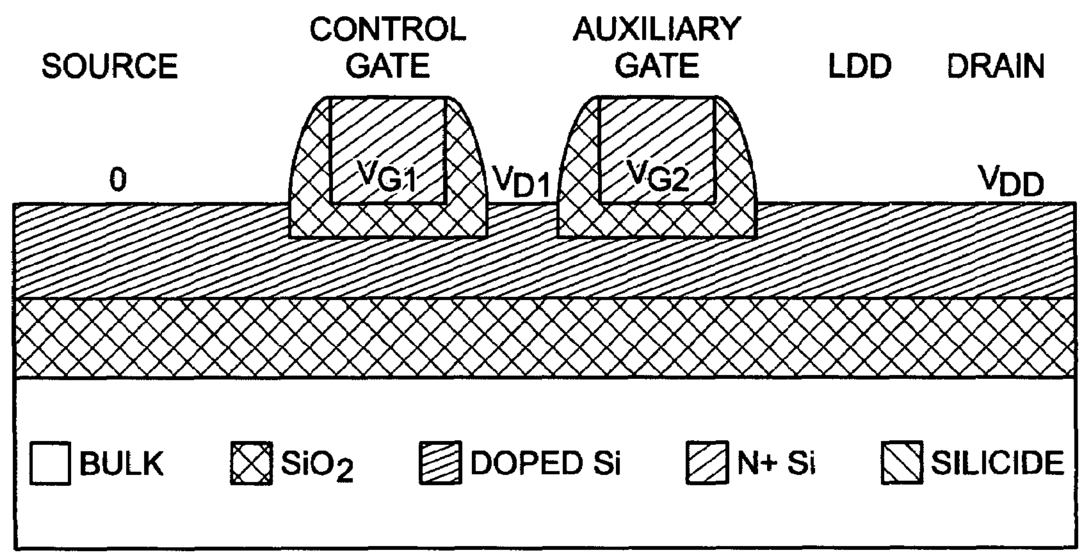
FIGS. 6 and 7 are partial cross-sectional views depicting the fabrication of the SOI high voltage transistor of FIG. 5.
Figure 7:
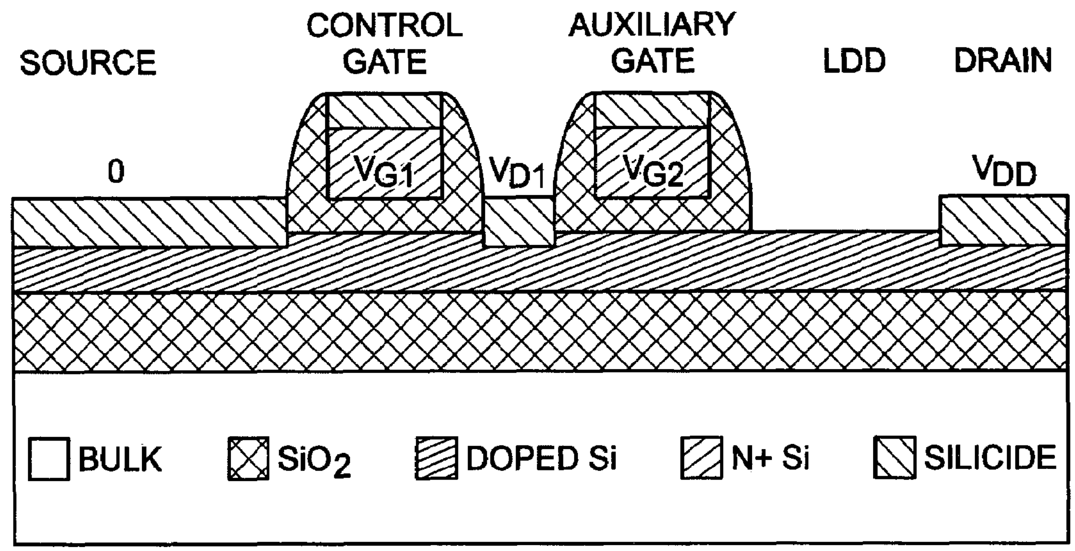

FIGS. 6 and 7 are partial cross-sectional views depicting the fabrication of the SOI high voltage transistor of FIG. 5. The device fabrication process is as follows:

1. The substrate is a commercially available SOI substrate. The buried oxide layer (BOX) has a thickness in the range of 0.5 to 3 μm. The top silicon layer is thinned to a thickness in the range of 20 nm to 1000 nm.

2. Adjust the threshold voltage with an ion implantation. Adjust the control gate doping density to obtain a desirable threshold voltage. The doping density is in the range of $10^{16}$/$cm^3$ to $10^{18}$/$cm^3$ range. The doping density under the auxiliary gate and the LDD drift region is in the order of $10^{16}$/$cm^3$.

3. Grow gate insulator. The gate insulator may be $SiO_2$ or any high k dielectric material. The thickness of control gate insulator is equivalent to a $SiO_2$ thickness of 1 nm to 100 nm, depending on the channel length. The thickness of the gate oxide under the auxiliary gate is in the range of 100 nm to 500 nm.

4. Deposit gate electrode material. The gate electrode material can be n+ doped silicon or other state-of-the-art metal gate material.

5. Photoresist etch the gate electrode.

6. Deposit oxide or nitride and etch the gate sidewalls.

7. Selectively deposit silicon for source/drain formation. See FIG. 6.

8. N+ dope the source/drain regions using phosphorus or arsenic.

9. Selectively silicide the source/drain regions. Any state-of-the-art salicide process may be used. However, Co and Ni are known to provide excellent results, see FIG. 7.

Figure 8:
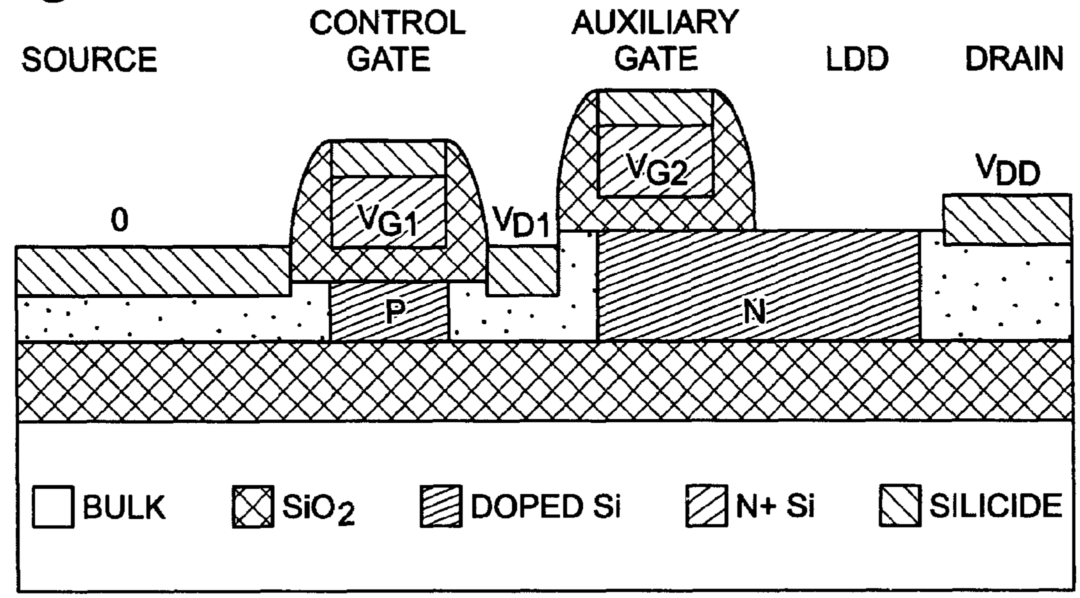
FIG. 8 is a partial cross-sectional view of a SOI high voltage transistor with a thicker top silicon active film under the auxiliary gate.

FIG. 8 is a partial cross-sectional view of a SOI high voltage transistor with a thicker top silicon active film under the auxiliary gate. The fabrication process is similar to that described above, except that Step 1 is replaced with the following steps:

a) Begin with an SOI wafer having a thick top silicon film. For example, a Si film thicker than 1.0 μm can be used. Grow 5 nm to 20 nm of oxide and deposit 50 nm to 100 nm of $Si_3N_4$.

b) Photoresist mask the region from the auxiliary gate to the drain area. Etch the exposed nitride.

c) Thermally oxidize, to thin the top silicon film to a thickness of 5 nm to 20 nm. This step may be performed simultaneously for adjacent regions with low voltage integrated circuitry. The low voltage devices may be either fully depleted or partially depleted device structures. Following the thermal oxidation, the process proceeds to Step 2, as explained above.

Figure 9:
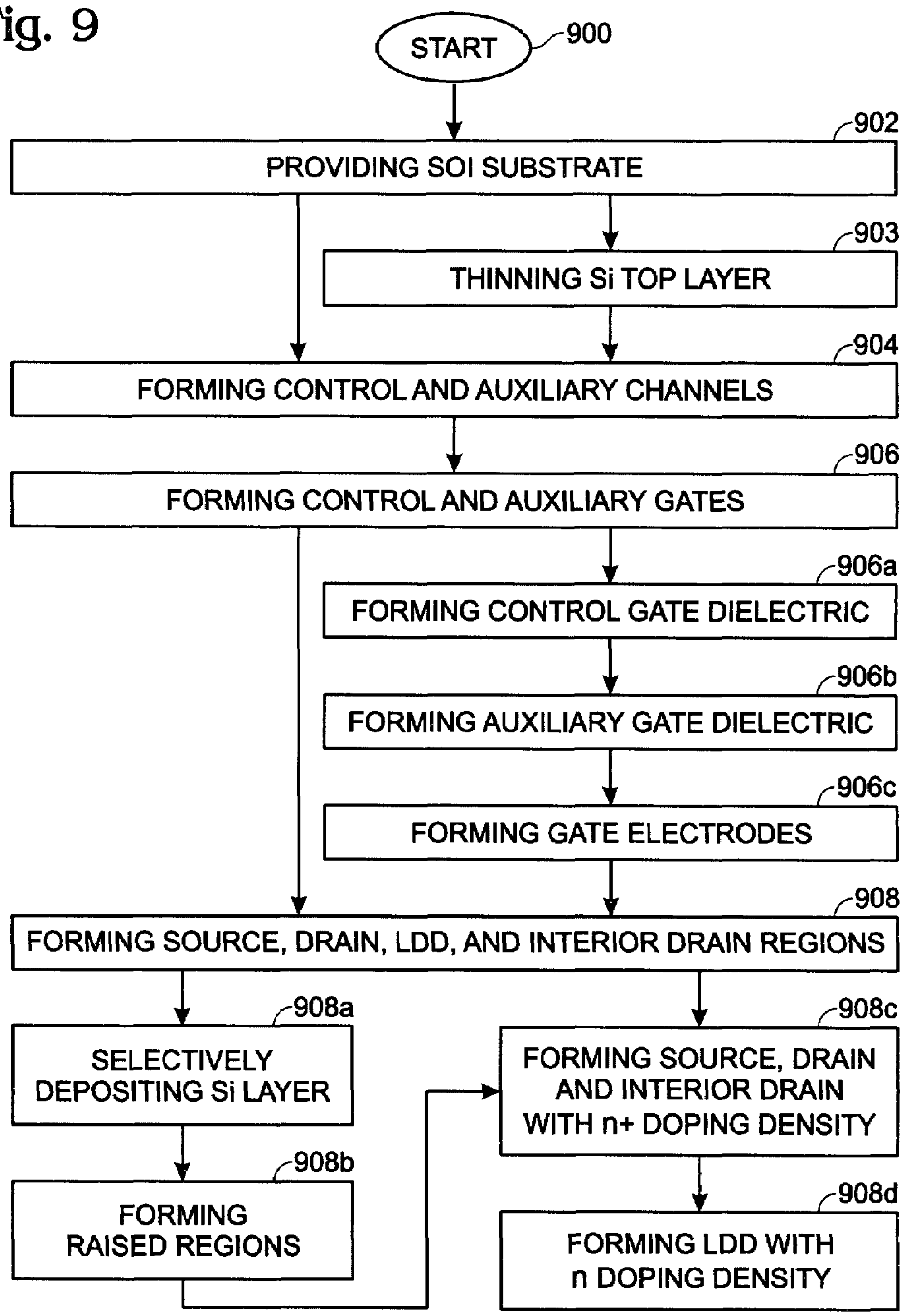
FIG. 9 is a flowchart illustrating a method for fabricating a SOI high voltage transistor.

FIG. 9 is a flowchart illustrating a method for fabricating a SOI high voltage transistor. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 900.

Step 902 provides a SOI substrate with a Si top layer. In some aspects, the Si top layer has a thickness in a range of 20 to 1000 nm. Step 904 forms a control channel and an adjacent auxiliary channel in the Si top layer. Step 906 forms a control gate overlying the control channel and an auxiliary gate overlying the auxiliary channel. Step 908 forms a drain region, a source region adjacent the control channel, a LDD region interposed between the auxiliary channel and the drain, and an interior drain region interposed between the control and auxiliary channels.

In one aspect, Step 903 thins the Si top layer in the source, control channel, and interior drain, to a thickness in a range of 5 to 200 nm. In another aspect, if Step 903 thins the Si top layer overlying the source, control channel, and interior drain to a thickness of less than 100 nm, then forming the source, drain, LDD, and interior drain regions may includes the following substeps. Step 908*a* selectively deposits a Si layer overlying source, drain, LDD, and interior drain regions, having a thickness in a range of 30 to 100 nm. Step 908*b* forms raised source, drain, LDD, and interior drain regions.

Forming the control and auxiliary channels in Step 904 may include the following substeps (not shown). Step 904*a* forms a control channel p dopant density in the range from $1\times10^{16}$ to $1\times10^{18}$ per cubic centimeter ($cm^{-3}$). Step 904*b* forms an auxiliary channel with an n dopant density in the range of $1\times10^{16}$ to $5\times10^{17}$ $cm^{-3}$.

Forming the control and auxiliary gates in Step 906 may include the following substeps. Step 906*a* forms a gate dielectric overlying the control channel having a thickness in the range of 1 to 100 nm. Step 906*b* forms a gate dielectric overlying the auxiliary channel having a thickness in the range of 30 to 500 nm. Step 906*c* forms gate electrodes overlying the date dielectrics.

Optionally, forming source, drain, LDD, and interior drain regions in Step 908 may include forming silicide overlying the source and drain regions. As another option, silicide may be formed on the interior drain.

Also with respect to Step 908, the LDD region is formed with a length in a range of 1 to 5 micrometers. That is, the distance between the auxiliary channel and the drain is 1 to 5 micrometers. In another aspect, forming source, drain, LDD, and interior drain regions in Step 908 includes the following substeps. Step 908*c* forms source, drain, and interior drain regions with n dopant densities in the range of $1\times10^{19}$ to $1\times10^{21}$ $cm^{-3}$. Step 908*d* forms an LDD region with an n dopant density in the range of $1\times10^{16}$ to $5\times10^{17}$ $cm^{-3}$.

A SOI high voltage transistor and associated fabrication process have been provided. Specific examples of structures, materials, doping levels, and layer thicknesses have been given to illustrate the invention. However, the invention is not limited to just these examples. Other variations and embodiments of the invention will occur to those skilled in the art.

We claim:

1. A method for fabricating a silicon (Si)-on-insulator (SOI) high voltage transistor, the method comprising:

providing a SOI substrate with a Si top layer;

forming a control channel and an adjacent auxiliary channel in the Si top layer;

forming a control gate overlying the control channel and an auxiliary gate overlying the auxiliary channel; and, forming a drain region separated from the auxiliary gate by a lightly doped drain (LDD) length in a range 1 to 5 micrometers, a source region adjacent the control channel, an LDD region adjacent the auxiliary gate and having the LDD length interposed between the auxiliary channel and the drain, and an interior drain region interposed between the control and auxiliary channels.

2. The method of claim 1 wherein providing a SOI substrate with a Si top layer includes providing a Si top layer having a thickness in a range of 20 to 1000 nanometers (nm); and, thinning the Si top layer in the source, control channel, and interior drain, to a thickness in a range of 5 to 200 nm.

3. The method of claim 2 wherein thinning the Si top layer includes thinning the Si top layer overlying the source, control channel, and interior drain to a thickness of less than 100 nm;

wherein forming source, drain, LDD, and interior drain regions includes:

selectively depositing a Si layer overlying source, drain, LDD, and interior drain regions, having a thickness in a range of 30 to 100 nm; and, forming raised source, drain, LDD, and interior drain regions.

4. The method of claim 1 wherein forming control and auxiliary channels includes:

forming a control channel p dopant density in a range from $1\times10^{16}$ to $1\times10^{18}$ per cubic centimeter ($cm^{-3}$); and, forming an auxiliary channel n dopant density in a range of $1\times10^{16}$ to $5\times10^{17}$ $cm^{-3}$.

5. The method of claim 4 wherein forming control and auxiliary gates includes:

forming a gate dielectric overlying the control channel having a thickness in a range of 1 to 100 nm;

forming a gate dielectric overlying the auxiliary channel having a thickness in a range of 30 to 500 nm; and, forming gate electrodes overlying the date dielectrics.

6. The method of claim 5 wherein forming source, drain, LDD, and interior drain regions includes forming silicide overlying the source and drain regions.

7. The method of claim 6 wherein forming source, drain, LDD, and interior drain regions includes forming silicide overlying the interior drain.

8. The method of claim 1 wherein forming source, drain, LDD, and interior drain regions further includes:

forming source, drain, and interior drain regions with n dopant densities in a range of $1\times10^{19}$ to $1\times10^{21}$ $cm^{-3}$; and, forming an LDD region with an n dopant density in a range of $1\times10^{16}$ to $5\times10^{17}$ $cm^{-3}$.

9. A silicon (Si)-on-insulator (SOI) high voltage transistor, the transistor comprising:

a SOI substrate with a Si top layer;

a control channel and an adjacent auxiliary channel formed in the Si top layer;

a source adjacent the control channel, an interior drain interposed between the control channel and the auxiliary channel, a lightly doped drain (LDD) with an LDD length in a range of 1 to 5 micrometers adjacent the auxiliary channel, and a drain adjacent the LDD region and separated from the auxiliary channel by the LDD length;

a control gate overlying the control channel; and, an auxiliary gate overlying the auxiliary channel.

10. The transistor of claim 9 wherein the Si top layer including the source, control channel, and interior drain has a thickness in a range of 5 to 200 nanometers (nm), and the Si top layer including the auxiliary channel, LDD, and drain region has a thickness in a range of 200 nm to 1000 nm.

11. The transistor of claim 9 wherein the control channel has a p dopant density in a range from $1\times10^{16}$ to $1\times10^{18}$ per cubic centimeter ($cm^{-3}$); and, wherein the auxiliary channel has an n dopant density in a range of $1\times10^{16}$ to $5\times10^{17}$ $cm^{-3}$.

12. The transistor of claim 11 wherein the source, drain, and interior drain have n dopant densities in a range of $1\times10^{19}$ to $1\times10^{21}$ $cm^{-3}$; and, wherein the LDD region has an n dopant density in a range of $1\times10^{16}$ to $5\times10^{17}$ $cm^{-3}$.

13. The transistor of claim 11 further comprising:

a gate dielectric overlying the control channel having a thickness in a range of 1 to 100 nm; and, a gate dielectric overlying the auxiliary channel having a thickness in a range of 30 to 500 nm.

14. The transistor of claim 13 wherein the Si top layer has a thickness of less than 100 nm;

the transistor further comprising:

a Si film selectively formed overlying the Si top layer having a thickness in a range of 30 to 100 nm; and, wherein the source, drain, LDD, and interior drain regions are raised source, drain, LDD, and interior drain regions formed in the Si film.

15. The transistor of claim 13 further comprising:

silicide overlying the source and drain regions.

16. The transistor of claim 15 further comprising:

silicide overlying the interior drain.

* * * * *